US011940345B2

(12) United States Patent
Friedrich et al.

(10) Patent No.: US 11,940,345 B2
(45) Date of Patent: Mar. 26, 2024

(54) MICROMECHANICAL COMPONENT FOR A CAPACITIVE PRESSURE SENSOR DEVICE

(71) Applicant: Robert Bosch GmbH, Stuttgart (DE)

(72) Inventors: Thomas Friedrich, Moessingen-Oeschingen (DE); Christoph Hermes, Kirchentellinsfurt (DE); Hans Artmann, Boeblingen-Dagersheim (DE); Heribert Weber, Nuertingen (DE); Peter Schmollngruber, Aidlingen (DE); Volkmar Senz, Metzingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 684 days.

(21) Appl. No.: 16/721,333

(22) Filed: Dec. 19, 2019

(65) Prior Publication Data

US 2020/0200631 A1  Jun. 25, 2020

(30) Foreign Application Priority Data

Dec. 21, 2018  (DE) .......................... 102018222712.8

(51) Int. Cl.
*G01L 9/00* (2006.01)
*B81B 3/00* (2006.01)
(Continued)

(52) U.S. Cl.
CPC .......... *G01L 9/0073* (2013.01); *B81B 3/0018* (2013.01); *G01L 1/148* (2013.01); *G01L 9/12* (2013.01); *B81B 2201/0264* (2013.01)

(58) Field of Classification Search
CPC ....... G01L 1/148; G01L 19/02; G01L 9/0073; G01L 9/12; B81B 3/0018
See application file for complete search history.

(56) References Cited

U.S. PATENT DOCUMENTS 5,332,469 A * 7/1994 Mastrangelo ....... B81C 1/00476
216/2
6,122,973 A * 9/2000 Nomura ................ G01L 9/0075
361/283.4
(Continued)

FOREIGN PATENT DOCUMENTS

CN  101063637 A  10/2007
CN  102183335 A  9/2011
(Continued)

OTHER PUBLICATIONS

English translation of Hegner, accessed from worldwide.espacenet. com Nov. 18, 2022 (Year: 2022).*

*Primary Examiner* — Kristina M Deherrera
*Assistant Examiner* — Jean F Morello
(74) *Attorney, Agent, or Firm* — NORTON ROSE FULBRIGHT US LLP; Gerard A. Messina

(57) ABSTRACT

A micromechanical component for a capacitive pressure sensor device includes a substrate; a frame structure that frames a partial surface; a membrane that is tensioned by the frame structure such that a self-supporting region of the membrane extends over the framed partial surface and an internal volume with a reference pressure therein is sealed in an airtight fashion, the self-supporting region of the membrane being deformable by a physical pressure on an external side of the self-supporting region that not equal to the reference pressure; a measurement electrode situated on the framed partial surface; and a reference measurement electrode that is situated on the framed partial surface and is electrically insulated from the measurement electrode.

25 Claims, 5 Drawing Sheets

(51) Int. Cl.
    *G01L 1/14*         (2006.01)
    *G01L 9/12*         (2006.01)

(56) References Cited

U.S. PATENT DOCUMENTS

| | | | | |
|---|---|---|---|---|
| 6,564,643 | B1 * | 5/2003 | Horie | G01L 9/0073 |
| | | | | 361/283.4 |
| 6,945,115 | B1 * | 9/2005 | Wang | G01L 9/0073 |
| | | | | 73/718 |
| 9,249,008 | B2 * | 2/2016 | Hsu | G01L 9/0073 |
| 9,352,955 | B2 * | 5/2016 | Molfese | G01L 9/00 |

FOREIGN PATENT DOCUMENTS

| | | | | |
|---|---|---|---|---|
| CN | 103998909 | A | 8/2014 | |
| CN | 205138705 | U | 4/2016 | |
| CN | 107850505 | A | 3/2018 | |
| DE | 102009000403 | A1 | 7/2010 | |
| TW | 201425205 | A | 7/2014 | |
| WO | 2004013593 | A1 | 2/2004 | |
| WO | WO-2004013593 | A1 * | 2/2004 | ......... G01L 19/0618 |
| WO | 2014025205 | A1 | 2/2014 | |
| WO | 2016192361 | A1 | 12/2016 | |
| WO | WO-2018135273 | A1 * | 7/2018 | ............... G01L 9/00 |

* cited by examiner

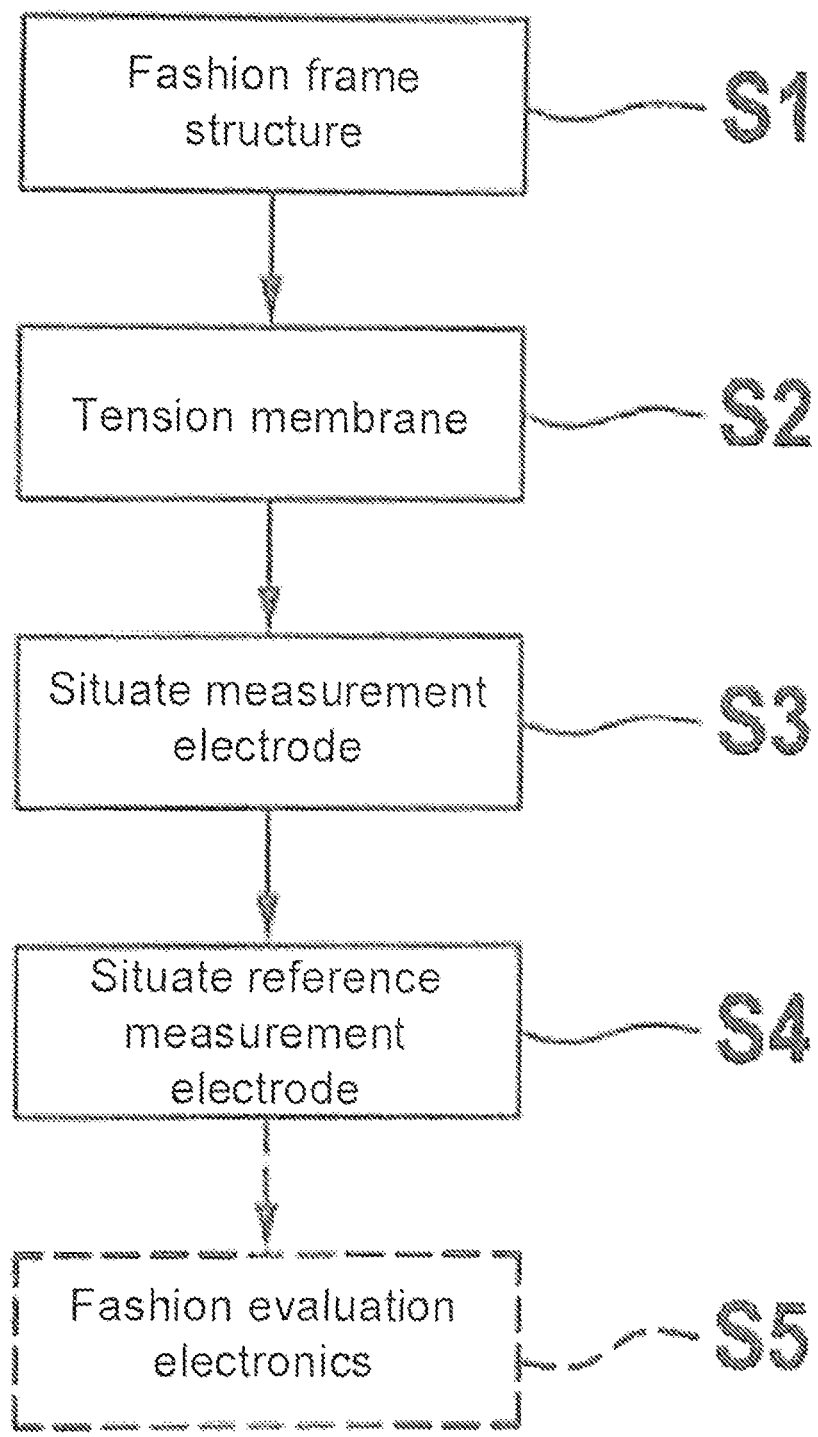

MICROMECHANICAL COMPONENT FOR A CAPACITIVE PRESSURE SENSOR DEVICE

CROSS-REFERENCE TO RELATED APPLICATIONS

The present application claims priority under 35 U.S.C. § 119 to DE 10 2018 222 712.8 filed in the Federal Republic of Germany on Dec. 21, 2018, the content of which is hereby incorporated by reference herein in its entirety.

FIELD OF THE INVENTION

The present invention relates to a micromechanical component for a capacitive pressure sensor device and to a capacitive pressure sensor device. The present invention also relates to a production method for a micromechanical component for a capacitive pressure sensor device and to a method for producing a capacitive pressure sensor device.

BACKGROUND

DE 10 2009 000 403 describes a capacitive pressure sensor that includes a substrate, an intermediate layer applied on one side of the substrate, a frame structure that surrounds a partial surface of the intermediate layer, and a membrane tensioned by the frame structure. The membrane and the frame structure enclose a hollow space having an internal pressure therein. Moreover, at least one self-supporting region of the membrane can be deformed by a physical pressure, not equal to the internal pressure, on an external side oriented away from the hollow space of the self-supporting region in such a way that a first electrode, fastened to the self-supporting region and extending into the hollow space, can be adjusted in relation to a second electrode on the framed partial surface. The physical pressure at the external side of the self-supporting region is meant to be determinable via an evaluation of a voltage between the two electrodes.

SUMMARY

The present invention provides a micromechanical component for a capacitive pressure sensor device, a capacitive pressure sensor device, a production method for a micromechanical component for a capacitive pressure sensor device, and a method for producing a capacitive pressure sensor device.

The present invention provides possibilities for integrating a measurement capacitor that includes the measurement electrode, and a reference capacitor that includes the reference measurement electrode, into a measurement structure formed by the frame structure and the membrane tensioned thereby, such that, despite the common integration of the measurement capacitor and of the reference capacitor in the same measurement structure, a measurement capacitance that is a function of a physical pressure acting on the external side can be tapped at the measurement capacitor, and a reference capacitance that is (substantially) independent of the physical pressure can be tapped at the reference capacitor. Through a common evaluation of the measurement and reference capacitances obtained in this way, environmental and system influences on the measurement structure, in particular on the membrane, can be determined and "filtered out," whereby an accurate and error-free measurement value can be determined for the pressure prevailing on the external side of the self-supporting region. At the same time, the common integration of the measurement capacitor and the reference capacitor in the same measurement structure permits a space-saving design of the micromechanical component. This facilitates a miniaturization of the micromechanical component, or of the capacitive pressure sensor device equipped therewith, and in this way expands the possible uses of the micromechanical component, or of the capacitive pressure sensor device. Moreover, material costs can be saved due to the miniaturization of the micromechanical component.

In an advantageous example embodiment of the micromechanical component, the measurement electrode, and a counter-electrode fashioned in the self-supporting region and/or fastened on the self-supporting region, are capable of being contacted electrically in such a way that a measurement voltage between the measurement electrode and the counter-electrode can be tapped. Preferably, the reference measurement electrode and a reference counter-electrode fashioned in the self-supporting region and/or fastened on the frame structure and/or on the framed partial surface are also capable of being electrically contacted in such a way that a reference voltage between the reference measurement electrode and the reference counter-electrode can be tapped. In this way, different values can easily be determined for the measurement voltage and the reference voltage, and can subsequently be evaluated in order to compensate environmental and/or system influences.

Preferably, the measurement voltage can be tapped between the measurement electrode and the counter-electrode fastened on the self-supporting region, and the reference voltage can be tapped between the reference measurement electrode and the reference counter-electrode fastened on the frame structure and/or the framed partial surface. In this case, the counter-electrode can be situated relative to the measurement electrode in such a way, and the reference counter-electrode can be situated relative to the reference measurement electrode in such a way, that, when there is a physical pressure on the external side of the self-supporting region equal to the reference pressure, the counter-electrode is at a first distance from the measurement electrode and the reference measurement electrode is at a second distance, less than the first distance, from the reference counter-electrode. The second distance between the reference measurement electrode and the reference counter-electrode can in particular be determined such that it corresponds approximately to the first distance between the measurement electrode and the counter-electrode when there is a physical pressure, which can be designated the "working pressure," on the external side of a capacitive pressure sensor device equipped with the micromechanical component. The "working pressure" can be understood as a physical pressure that as a rule prevails or is desired at the external side during active use of the capacitive pressure sensor device. In this case, a comparatively symmetrical and relatively simple evaluation circuit of the physical pressure prevailing at the external side during the active use of the capacitive pressure sensor device can be determined accurately and without error.

In a further advantageous example embodiment of the micromechanical component, a midpoint of the partial surface surrounded by the frame structure can be defined, the measurement electrode covering the midpoint, while the reference measurement electrode is situated at a distance from the midpoint on the framed partial surface. This example embodiment of the micromechanical component makes use of the fact that a partial surface/center surface, extending over the midpoint of the framed partial surface, of the self-supporting region of the membrane is as a rule more strongly bent by the physical pressure, not equal to the reference pressure, acting on the external side than is an edge surface of the self-supporting region, and therefore the partial surface/center surface extending over the midpoint of the framed partial surface is "more pressure-sensitive" than is the edge surface of the self-supporting region. Thus, solely through the configuration described in this paragraph of the measurement electrode and the reference measurement electrode, it can be ensured that the measurement voltage determined by the measurement electrode is a function of the physical pressure on the external side, while the reference voltage determined by the reference electrode is (almost) insensitive to pressure.

In particular, the measurement electrode can be situated within a surface surrounded by the reference measurement electrode. This also ensures the advantage described in the preceding paragraph.

For example, the self-supporting region of the membrane can be deformable by a physical pressure, greater than the reference pressure, prevailing at the external side of the self-supporting region, in such a way that a mid-region of the self-supporting region can be defined that is at a smaller distance from the framed partial surface than other partial regions of the self-supporting region, the measurement electrode being situated on the framed partial surface in such a way that the mid-region of the self-supporting region is displaced by the physical pressure, greater than the reference pressure, in the direction towards the measurement electrode, and the reference measurement electrode being situated on the framed partial surface in such a way that an edge region of the self-supporting region, outside the mid-region, is bent in the direction towards the reference measurement electrode by the physical pressure greater than the reference pressure. The physical pressure prevailing at the external side of the self-supporting region of the membrane thus significantly influences a current value of the measurement value measured by the measurement electrode, while a current value of the reference voltage measured by the reference measurement electrode is hardly impaired, or is not impaired, by the physical pressure acting on the external side.

The advantages described above are also ensured given a capacitive pressure sensor device having a corresponding micromechanical component and an evaluation electronics that is designed to determine and to output a measurement value relating to the physical pressure prevailing at the external side of the self-supporting region, at least taking into account the tapped measurement voltage and the tapped reference voltage.

A corresponding production method for a micromechanical component for a capacitive pressure sensor device also brings about the advantages described above. The production method can be developed in accordance with the above-explained example embodiments of the micromechanical component.

In addition, a corresponding method for producing a capacitive pressure sensor device also brings about the advantages described above. The method for producing a capacitive pressure sensor device can also be further developed corresponding to the above-explained example embodiments of the micromechanical component.

Further features and advantages of the present invention are explained below on the basis of the figures.

BRIEF DESCRIPTION OF THE DRAWINGS

FIG. 9 is a flowchart illustrating a production method for a micromechanical component according to an example embodiment of the present invention.

DETAILED DESCRIPTION

Figure 1:
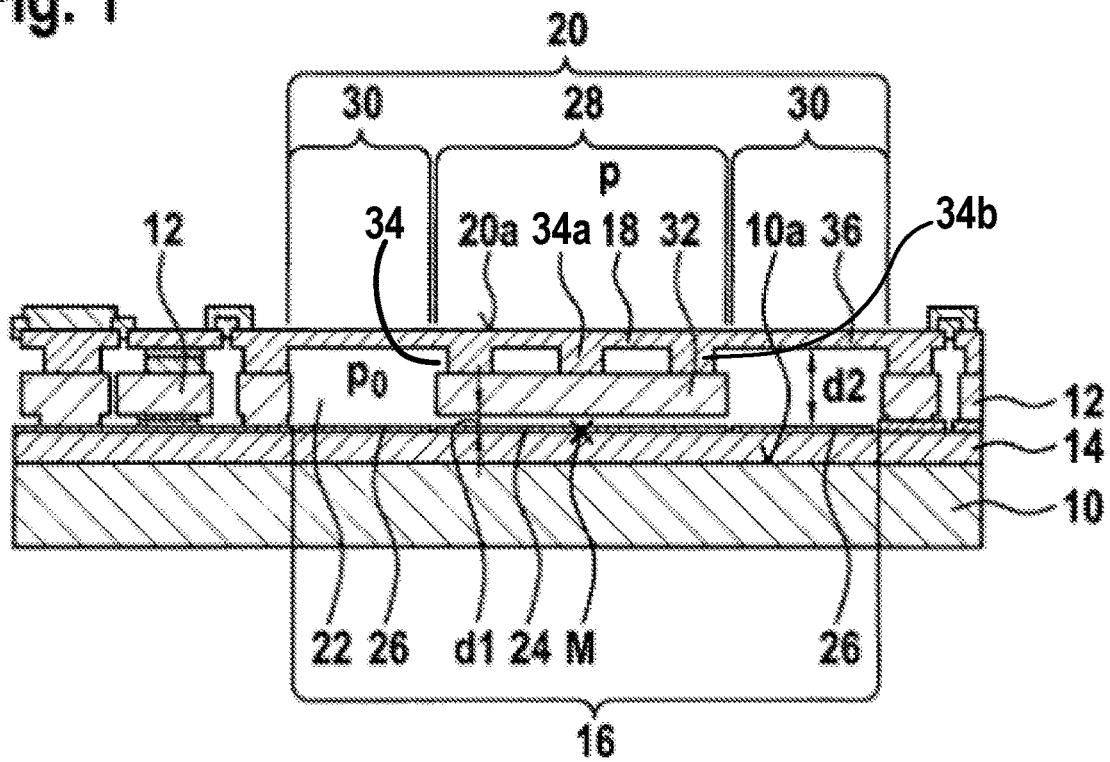
FIGS. 1-8 show various schematic representations of example embodiments of the micromechanical component.

FIG. 1 shows a schematic representation of a first example embodiment of a micromechanical component. The micromechanical component shown schematically in FIG. 1 has a substrate 10 that preferably includes at least one semiconductor material. Substrate 10 can for example be a silicon substrate. However, substrate 10 can also include at least one further material instead of, or in addition to, silicon.

The micromechanical component also has a frame structure 12 that is fashioned on a substrate side 10a of substrate 10, or on at least one intermediate layer 14 on substrate 10, in such a way that frame structure 12 encloses a partial surface 16 of substrate 10 and/or of the at least one intermediate layer 14. For example, frame structure 12 can be fashioned, as intermediate layer 14, on an insulating layer 14 that covers substrate side 10a. Intermediate layer 14 can also include a plurality of sub-layers, such as a silicon oxide layer and a (silicon-rich) silicon nitride layer. Via frame structure 12, a membrane/membrane layer 18 is tensioned in such a way that a self-supporting region 20 of membrane 18 extends over the framed partial surface 16. Membrane 18 can include at least one semiconductor material, such as silicon. However, membrane 18 can include at least one further material instead of, or in addition to, silicon.

In addition, an internal volume 22 enclosed by frame structure 12 and membrane 18 with a reference pressure $p_0$ therein is sealed in airtight fashion. Self-supporting region 20 of membrane 18 is deformable/deformed by a physical pressure p, not equal to reference pressure $p_0$, on an external side 20a of self-supporting region 20, oriented away from internal volume 22. The micromechanical component also has a measurement electrode 24 that is situated on framed partial surface 16. In addition to measurement electrode 24, a reference measurement electrode 26, that is electrically insulated from measurement electrode 24, is situated on framed partial surface 16. The (single) self-supporting region 20 of the (same) membrane 18 thus extends over both measurement electrode 24 and reference electrode 26.

The common configuration of measurement electrode 24 and reference measurement electrode 26 inside internal volume 22, which is sealed airtight, results in a space-saving design of the micromechanical component. This facilitates a miniaturization of the micromechanical component. In addition, due to the space-saving design of the micromechanical component, material can be saved during its production. The space-saving design of the micromechanical component thus also contributes to the reduction of its production costs.

Despite the integration of measurement electrode 24 and reference electrode 26 in the same internal volume 22, measurement electrode 24 can be used to measure a measurement voltage that is a function of the physical pressure p on external side 20a of self-supporting region 20, while a reference voltage that is (substantially) independent of physical pressure p on external side 20a can be measured by reference measurement electrode 26. The reference voltage is thus a function (almost) only of environmental and/or system influences, such as a prevailing temperature, and is therefore advantageously suitable for compensating/"filtering out" such influences from the measurement voltage. This ensures that the physical pressure p prevailing at external side 20a of self-supporting region 20 can be reliably determined using the measurement voltage (also taking into account the reference voltage), in particular (almost) unfalsified by environmental and/or system influences.

The suitability of measurement electrode 24 for measuring the measurement voltage that is a function of physical pressure p, and the suitability of reference measurement electrode 26 for measuring the reference voltage that is (substantially) independent of physical pressure p, can be ensured by a simple configuration of electrodes 24 and 26 on framed partial surface 16, by placing measurement electrode 24 adjacent to/"under" a "pressure-sensitive partial segment" of self-supporting region 20, while reference measurement electrode 26 is situated adjacent to/"under" an (almost) "pressure-stable partial segment" of self-supporting region 20. The "pressure-sensitive partial segment" of self-supporting region 20 can be understood as a partial surface of self-supporting region 20 that is significantly deflected and/or deformed when there is a physical pressure p on external side 20a that deviates significantly from reference pressure $p_0$. Correspondingly, the "pressure-stable partial segment" of self-supporting region 20 can be understood as a different partial surface of self-supporting region 20 that is less strongly deflected and/or deformed, in comparison with the "pressure-sensitive partial segment," even given physical pressure p, differing significantly from reference pressure $p_0$, on external side 20a. As is clear from the further description, the advantageous suitability of measurement electrode 24 for measuring the measurement voltage that is a function of physical pressure p, and of reference measurement electrode 26 for measuring the reference voltage that is (almost) independent of physical pressure p, can already be brought about with such a configuration of electrodes 24 and 26 on framed partial surface 16.

For example, a midpoint M of partial surface 16 enclosed by frame structure 12 can be defined, with measurement electrode 24 covering midpoint M, while reference measurement electrode 26 is situated at a distance from midpoint M on framed partial surface 16. By using such a configuration of electrodes 24 and 26, the fact can be exploited that a partial surface, extending over midpoint M of framed partial surface 16, of self-supporting region 20 (as "pressure-sensitive partial segment") is strongly deflected and/or deformed when there is a pressure p on external side 20a that differs significantly from reference pressure $p_0$. The partial surface of self-supporting region 20, which in this case extends over reference measurement electrode 26, is at the same time (as "pressure-stable partial segment") deflected and/or deformed significantly less strongly. In particular, measurement electrode 24 can cover midpoint M in such a way that midpoint M is situated at a minimal distance from a midpoint/focal point (not shown) of measurement electrode 24.

Alternatively or in addition, measurement electrode 24 can be situated within a surface surrounded by reference measurement electrode 26. In this case, the configuration of electrodes 24 and 26 has the further advantage that the partial surface, extending over reference measurement electrode 26, of self-supporting region 20 (as "pressure-stable partial segment") as a rule has, due to its realization as an edge surface of self-supporting region 20, a significantly lower bending strength than does the surface extending over measurement electrode 24 (as "pressure-sensitive partial segment"), which can be designated the mid-surface of self-supporting region 20. Moreover, the configuration of electrodes 24 and 26 in this case also makes use of the additional advantage that reference electrode 26 occupies an edge surface of framed partial surface 16 that conventionally remains unused. The design described here of the micromechanical component can thus be used to achieve the aimed-at miniaturization of the micromechanical component. However, it is also to be noted that an advantageous design of the micromechanical component is already provided if reference electrode 26 is situated on only one side, or on two or three sides, of measurement electrode 24.

In the example embodiment of FIG. 1, the configuration of electrodes 24 and 26 can also be described by saying that self-supporting region 20 of membrane 18 is deformable/is deformed by a physical pressure p, greater than reference pressure $p_0$, prevailing on external side 20a of self-supporting region 20 in such a way that a mid-region 28 of self-supporting region 20 can be defined that is at a smaller distance from framed partial surface 16 than other partial regions of the self-supporting region, measurement electrode 24 being situated on framed partial surface 16 in such a way that mid-region 28 of self-supporting region 20 is displaced by physical pressure p, greater than reference pressure $p_0$, in the direction towards measurement electrode 24. Mid-region 28 thus extends over (as "pressure-sensitive partial segment") measurement electrode 24. Reference measurement electrode 26, in contrast, is situated on framed partial surface 16 in such a way that an edge region 30 of self-supporting region 20 situated outside mid-region 28 of self-supporting region 20 is bent only slightly in the direction towards reference measurement electrode 26 by physical pressure p, greater than reference pressure $p_0$. Thus, physical pressure p, greater than reference pressure $p_0$, brings about a change of distance between edge region 30 and reference measurement electrode 26 that is significantly smaller than a change of distance that is also brought about between mid-region 28 and measurement electrode 24. Edge region 30 extending over reference measurement electrode 36 can thus be referred to as a "pressure-stable partial segment."

In the micromechanical component of FIG. 1, measurement electrode 24 and a counter-electrode fastened on self-supporting region 20 are capable of being electrically contacted in such a way that the measurement voltage between measurement electrode 24 and counter-electrode 32 can be tapped. Measurement electrode 24 and counter electrode 32 can therefore be referred to as useful capacitance/useful capacitor. Counter-electrode 32 is fastened on an internal side of self-supporting region 20 oriented away from external side 20a. Counter-electrode 32 extends into interior volume 22 in such a way that there is only a comparatively small first distance d1 between measurement electrode 24 and counter-electrode 32, first distance d1 varying as a function of the physical pressure p prevailing on external side 18. The comparatively small first distance d1 between measurement electrode 24 and counter-electrode 32 contributes to the increase in the pressure sensitivity of the useful capacitor. Counter-electrode 32 can be connected to self-supporting region 20 at a point or by a surface, in particular via connecting region 34 that includes, for example, a peripheral connector 34b and a central connector 34a. Preferably, counter-electrode 32 is suspended on a "pressure-sensitive partial segment" of self-supporting region 20, such as on mid-region 28 of self-supporting region 20.

Alternatively, counter-electrode 32 can also be fashioned in self-supporting region 20, specifically only within a "pressure-sensitive partial segment" of self-supporting region 20. In particular, counter-electrode 32 can be fashioned only within mid-region 28 of self-supporting region 20.

Reference measurement electrode 26, and a reference counter-electrode 36 fashioned in self-supporting region 20, are also capable of being electrically contacted in such a way that the reference voltage between reference measurement electrode 26 and reference counter-electrode 36 can be tapped. Reference measurement electrode 26 and reference counter-electrode 36 can be described as reference capacitance/reference capacitor. Between reference measurement electrode 26 and reference counter-electrode 36 there is a second distance d2 that is significantly larger than first distance d1 between measurement electrode 24 and counter-electrode 32. The reference capacitor is already less pressure-sensitive due to the second distance d2, significantly larger in comparison with first distance d1, between reference measurement electrode 26 and reference counter-electrode 36. Reference counter-electrode 36 is preferably fashioned only within a "pressure-stable partial segment" of self-supporting region 20, for example only within edge region 30 of self-supporting region 20.

Figure 2:
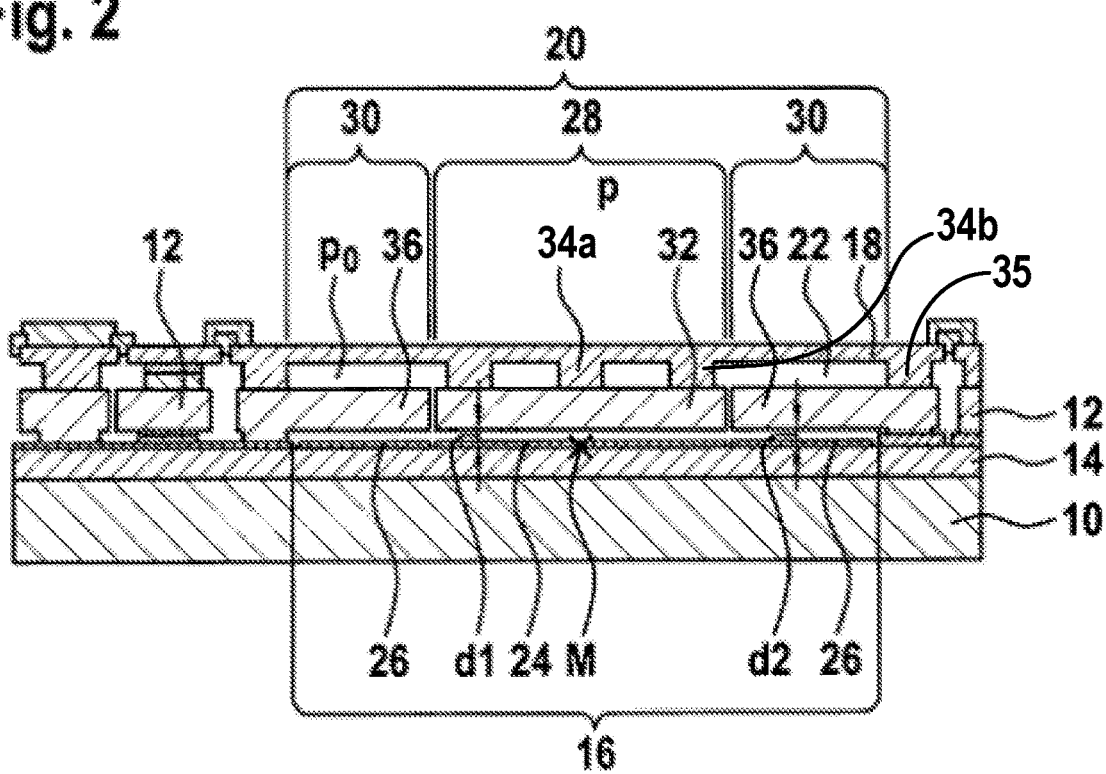

FIG. 2 shows a schematic representation of a second example embodiment of the micromechanical component. The micromechanical component shown schematically in FIG. 2 has, as its sole difference from the example embodiment described above, a reference counter-electrode 36 situated in internal volume 22 that is fastened to frame structure 12. A radially exterior edge of reference counter-electrode 36 is shown to be connected to the self-supporting region 20 via a second connector 35 that extends from the self-supporting region 20 to the reference counter-electrode 36.

A position of reference counter-electrode 36 relative to reference measurement electrode 26 is thus not influenced by the current shape of self-supporting region 20. The position of reference counter-electrode 36 relative to reference measurement electrode 26 is therefore also independent of the physical pressure p acting on external side 20a of self-supporting region 20. While the measurement voltage that can be tapped between measurement electrode 24 and counter-electrode 32 fastened on self-supporting region 20 varies corresponding to the physical pressure p prevailing at external side 18, the reference voltage, which can be tapped between reference measurement electrode 26 and reference counter-electrode 36 fastened on frame structure 12, is absolutely unaffected by physical pressure p.

In particular, counter-electrode 32 can be situated relative to measurement electrode 24, and reference counter-electrode 36 can be situated relative to reference measurement electrode 26, in such a way that given a physical pressure p on external side 18 of self-supporting region 20 that is equal to reference pressure $p_0$, the counter-electrode is at a first distance $d1(p=p_0)$ from measurement electrode 24 and reference measurement electrode 26 is at a second distance $d2(p=p_0)$, less than first distance $d1(p=p_0)$, from reference counter-electrode 36. The values for first distance $d1(p=p_0)$ and second distance $d2(p=p_0)$, given a physical pressure p on external side 18 equal to reference pressure $p_0$, can be defined such that counter-electrode 32 is situated at the second distance $d2(p=p_0)$ from measurement electrode 24 only when a "working pressure" of the capacitive pressure sensor device, equipped with the micromechanical component, is present on external side 18. The "working pressure" can be understood as a physical pressure p that as a rule prevails or is desired during an active use of the capacitive pressure sensor device on external side 18. The "working pressure" can be for example 1 bar. Alternatively or in addition, the values for first distance $d1(p=p_0)$ and second distance $d2(p=p_0)$ when there is a physical pressure p equal to reference pressure $p_0$ on external side 18 can also be defined such that at the "working pressure" of the capacitive pressure sensor device on external side 18, the measurement voltage is equal to the reference voltage. Using each of the definitions described here of the values for the first distance $d1(p=p_0)$ and the second distance $d2(p=p_0)$ when there is a physical pressure p on external side 18 equal to reference pressure $p_0$, a good sensitivity of the capacitive pressure sensor device to deviations of the physical pressure p currently present at external side 18 from the "working pressure" can be brought about.

In the micromechanical component of FIG. 2 (and the example embodiments described below), counter-electrode 32 and reference counter-electrode 36 can be structured out from a common material layer. The method steps carried out for the common formation of counter-electrode 32 and reference counter-electrode 36 can be standard processes in semiconductor technology. The common production of counter-electrode 32 and of reference counter-electrode 36 can therefore be carried out at low cost.

With regard to further features and properties of the micromechanical component of FIG. 2, reference is made to the example embodiment described previously.

Figure 3:
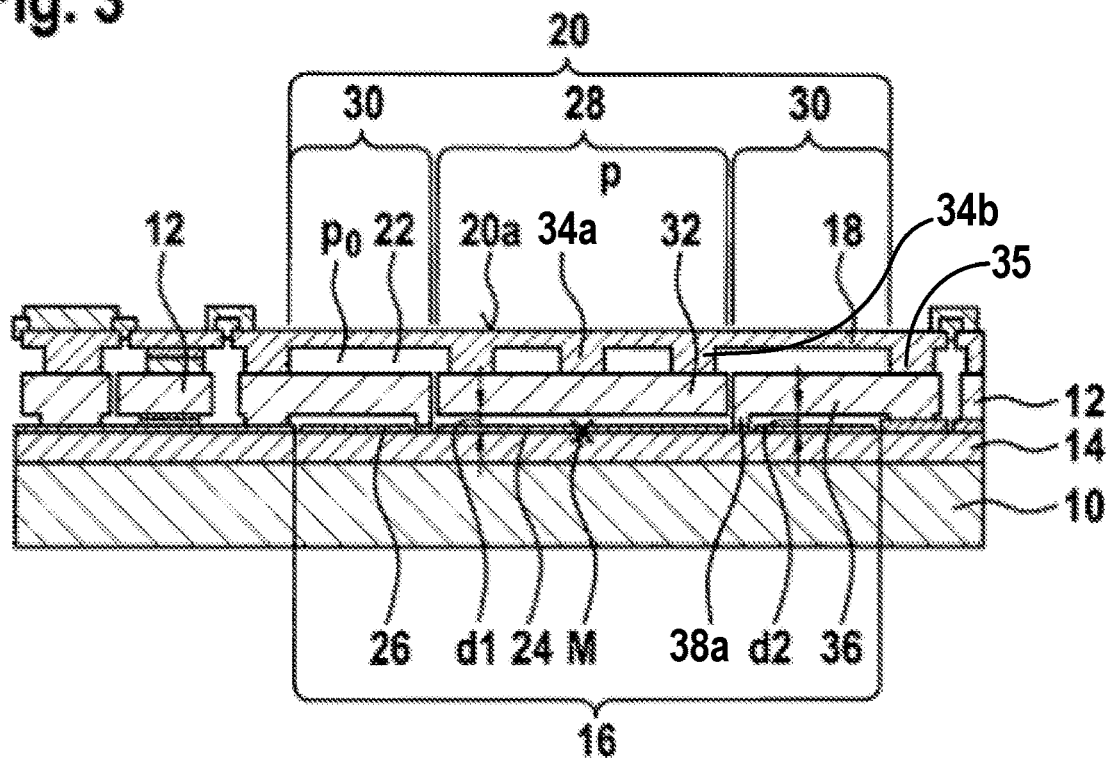
Figure 4:
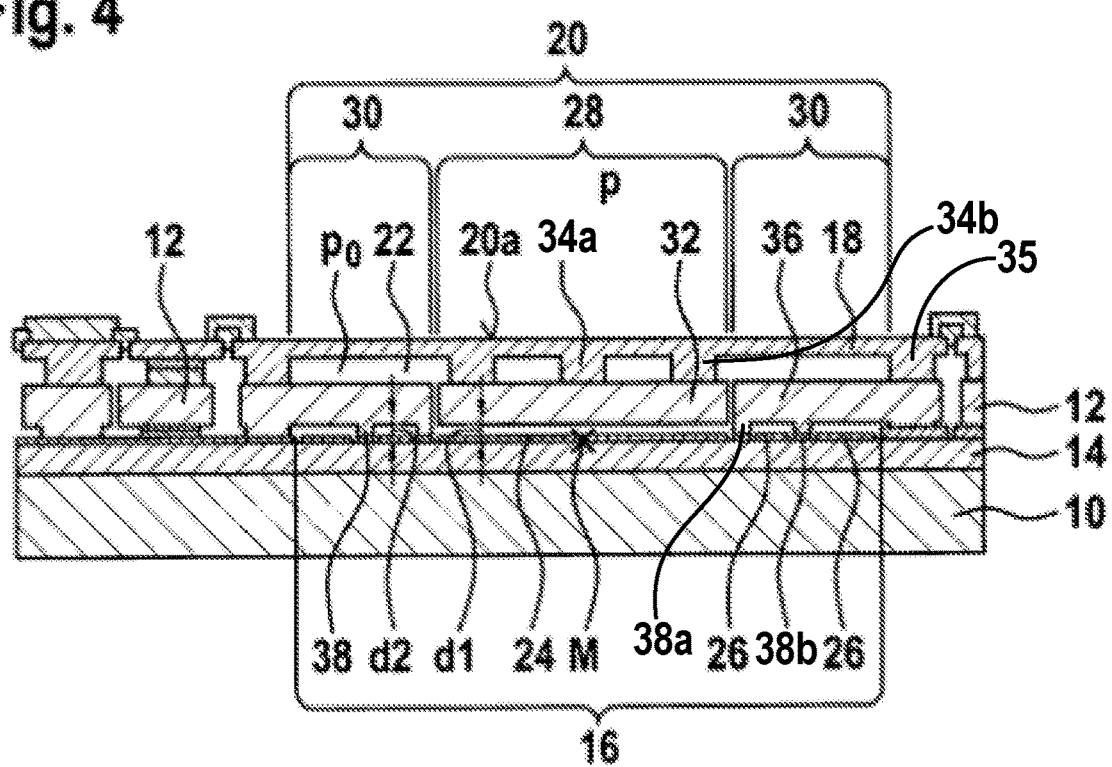

FIG. 3 shows a schematic representation of a third example embodiment of the micromechanical component. The micromechanical component shown schematically in FIG. 3 differs from the previously explained example embodiment in that reference counter-electrode 36, situated in interior volume 22, is also fastened on framed partial surface 16 in addition to its fastening on frame structure 12. For this purpose, a connecting region 38, can extend from reference counter-electrode 36 to framed partial surface 16. For example, reference counter-electrode 36 shown in FIG. 3 is connected to framed partial surface 16 via a connector 38a of the connecting region 38 formed on its inner edge oriented towards counter-electrode 32. Preferably, electrodes 24 and 26 are situated at a distance from connecting region 38.

With regard to further properties and features of the micromechanical component of FIG. 3, reference is made to the previously described example embodiments.

FIGS. 4-7 show schematic representations of further example embodiments of the micromechanical component.

Figure 5:
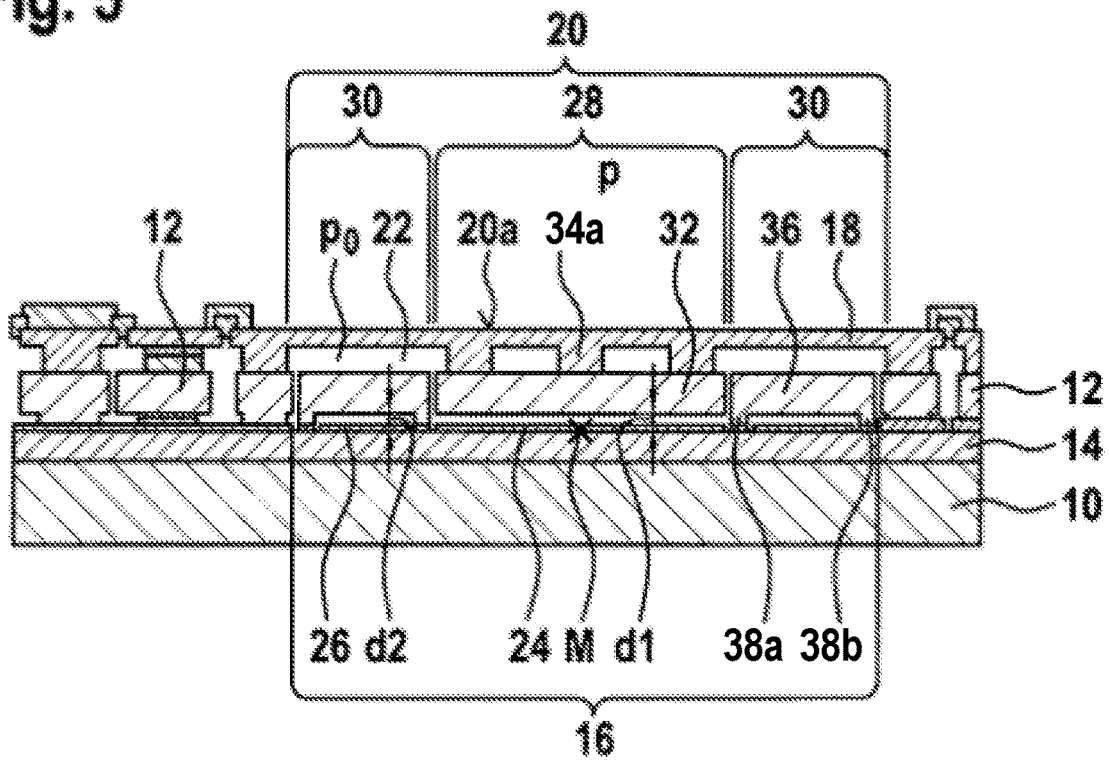
Figure 6:
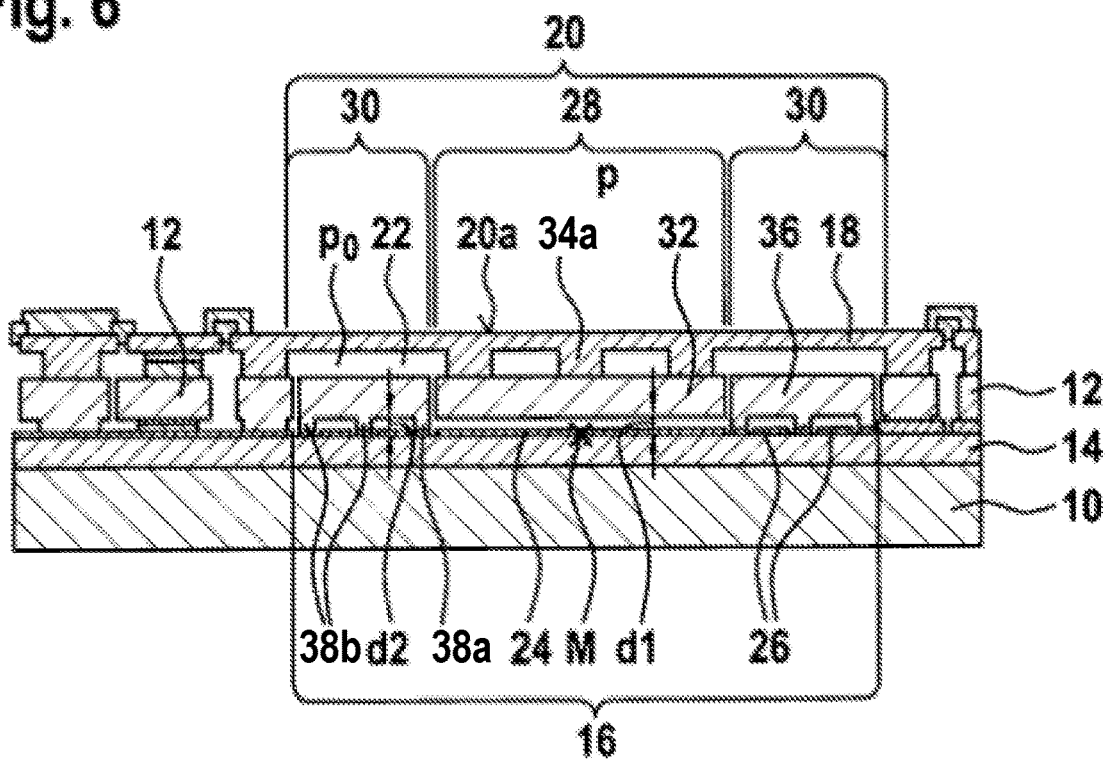
Figure 7:
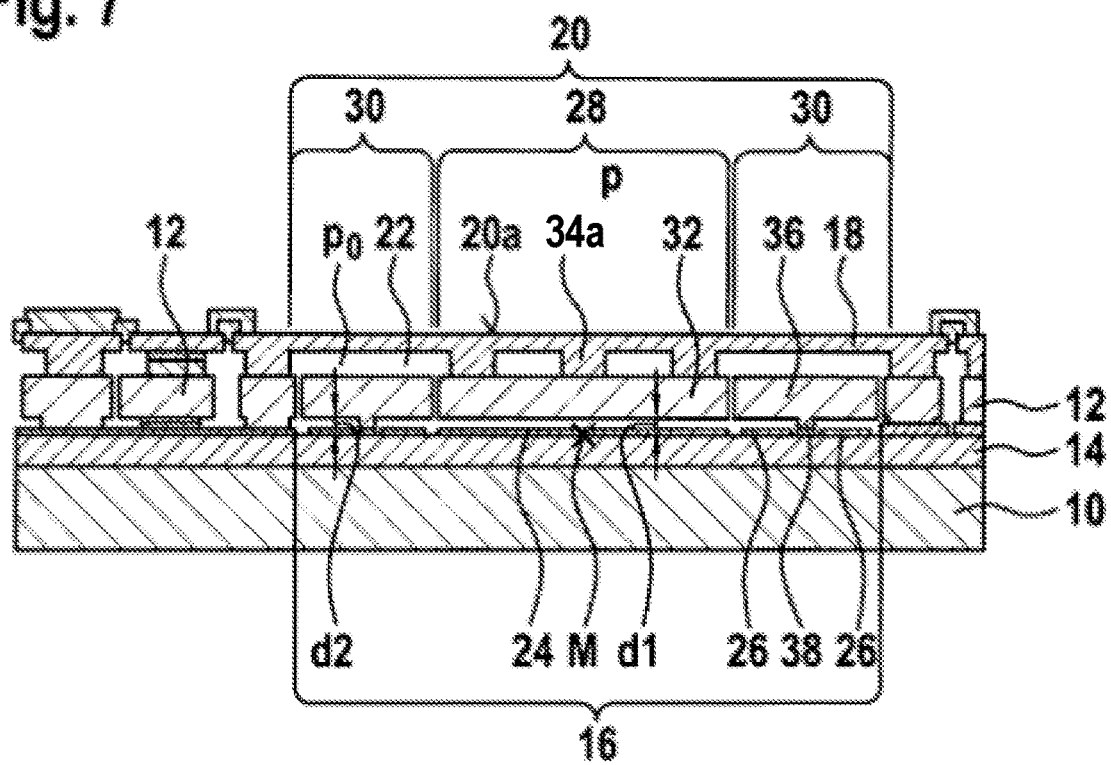

As a comparison of the micromechanical components of FIGS. 4-7 makes apparent, reference counter-electrode 36 can also be connected to framed partial surface 16 via a plurality of connectors 38a and 38b of connecting region 38. In the micromechanical component of FIG. 4, reference counter-electrode 36 is connected to framed partial surface 16 via connector 38a of connecting region 38, fashioned on its inner edge, and via a centrically fashioned connector 38b of connecting region 38. In the example of FIG. 5, reference counter-electrode 36 is connected to framed partial surface 16 via connector 38a of connecting region 38, situated on its inner edge, and via a connector 38b of connecting region 38 fashioned on its outer edge oriented away from counter-electrode 32. Reference counter-electrode 36 shown in FIG. 6 is connected to framed partial surface 16 via three connectors of connecting region 38 that are situated on its inner edge, on its outer edge, and in a region between the inner edge and the outer edge (possibly centrically). In contrast, the micromechanical component shown in FIG. 7 has a reference counter-electrode 36 that is connected to framed partial surface 16 only via a connector of connecting region 38 fashioned between the inner edge and the outer edge (possibly centrically). As can be seen in FIGS. 5-7, a fastening of reference counter-electrode 36 to frame structure 12 can also be omitted.

A resonant frequency of reference counter-electrode 36 can be significantly increased through the formation of a plurality of connectors of connecting region 38 via which the same reference counter-electrode 36 is connected to framed partial surface 16. In this way, a deflection of reference counter-electrode 36 caused by electrostatic forces or by an intrinsic stress gradient can be significantly reduced.

With regard to further properties and features of the micromechanical components of FIGS. 4-7, reference is made to the previously described example embodiments.

With regard to FIGS. 2-7, the use of reference counter-electrode 36 not connected to membrane 18, regardless of whether reference counter-electrode 36 is fastened to frame structure 12 and/or to framed partial surface 16, always ensures the advantage that reference counter-electrode 36 has no influence on the bending strength of self-supporting region 20 of membrane 18. Self-supporting region 20 can thus deform freely despite reference counter-electrode 36, as a reaction to physical pressure p on its external side 20a. At the same time, the reference capacitor, given a use of reference counter-electrode 36 situated in internal volume 22, is situated completely within internal volume 22, and is therefore completely insensitive to pressure.

Figure 8:
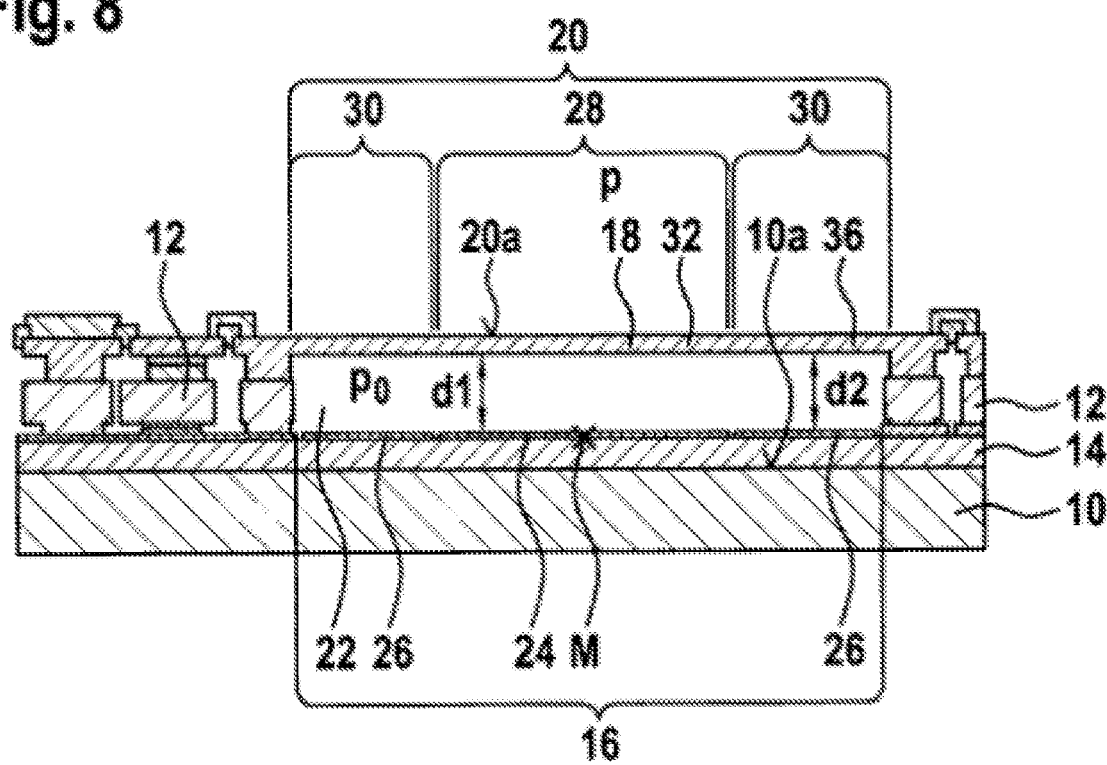

FIG. 8 shows a schematic representation of a further example embodiment of a micromechanical component. In the micromechanical component of FIG. 8, counter-electrode 32 and reference counter-electrode 36 are both "integrated" into the self-supporting region 20 of membrane 18. The formation of a counter-electrode 32 that is "suspended" on self-supporting region 20 can thus also be omitted. With regard to further properties and features of the micromechanical component of FIG. 8, reference is made to the previously described example embodiments.

All the micromechanical components described above remedy the conventional disadvantage that the formation of a reference capacitor according to the existing art requires exactly as much chip surface on substrate 10 as is required to form a useful capacitor. This conventional disadvantage is remedied through the integration of electrodes 24 and 26 into interior volume 22. The integration of electrodes 24 and 26 into interior volume 22 thus enables a savings of surface on substrate 10 by approximately a factor of 2 compared to the existing art. Even given a comparatively large surface of membrane 18, or of its self-supporting region 20, in particular in order to increase the sensitivity to pressure of self-supporting region 20, the integration of the measurement and reference capacitors into the same measurement structure (i.e., the situation of electrodes 24 and 26 below self-supporting region 20 of the same membrane 18) offers a significant savings of surface, by approximately a factor of 2, compared to the existing art. Each of the micromechanical components described above can be integrated into a capacitive pressure sensor device. Preferably, the capacitive pressure sensor device also has an evaluation electronics that is designed to determine and to output a measurement value relating to the physical pressure p prevailing on external side 20a of self-supporting region 20 in each case, at least taking into account the tapped measurement voltage and the tapped reference voltage. This enables a reliable determination of the physical pressure p, in particular (substantially) unfalsified by environmental and/or system influences.

FIG. 9 is a flowchart explaining an example embodiment of the production method for a micromechanical component.

All micromechanical components described above can be produced using the production method described below. However, the practicability of the production method is not limited to the production of these micromechanical components.

In a method step S1, a frame structure is fashioned on a substrate, and frames a partial surface of the substrate and/or at least one intermediate layer present on the substrate. As method step S2, via the frame structure a membrane is tensioned in such a way that a self-supporting region of the membrane extends over the framed partial surface. If, after carrying out method steps S1 and S2, an interior volume enclosed by the frame structure and the membrane, with a reference pressure therein, is still not sealed in airtight fashion, this is done as an additional method step (not shown). In method step S2, moreover, the membrane is tensioned in such a way that the self-supporting region of the membrane is deformable/deformed by a physical pressure on an external side, oriented away from the internal volume, of the self-supporting region, the physical pressure being unequal to the reference pressure. Method steps S1 and S2 can be carried out in any sequence, simultaneously, or temporally overlapping.

Method steps S3 and S4 are also carried out before or between method steps S1 and S2. As method step S3, a measurement electrode is situated/formed on the framed partial surface. As method step S4, a reference measurement electrode electrically insulated from the measurement electrode is in addition situated/formed on the framed partial surface, in addition to the measurement electrode. Method steps S3 and S4 can be carried out simultaneously.

Preferably, the measurement electrode and a counter-electrode fashioned in the self-supporting region and/or fastened on the self-supporting region are made capable of being electrically contacted in such a way that a measurement voltage between the measurement electrode and the counter-electrode can be tapped. Preferably, the reference measurement electrode and a reference counter-electrode, fashioned in the self-supporting region and/or fastened on the frame structure and/or on the framed partial surface, are also made electrically contactable in such a way that a reference voltage between the reference measurement electrode and the reference counter-electrode can be tapped. Examples of the configuration of the counter-electrode and of the reference counter-electrode have been described above.

Method steps S1-S4 can also be part of a method for producing a capacitive pressure sensor device. In this case, in addition to the production of the micromechanical component according to method steps S1-S4, an (optional) method step S5 is additionally carried out. As method step S5, an evaluation electronics is fashioned in such a way that the evaluation electronics determines and outputs a measurement value relating to the physical pressure prevailing in each case on the external side of the self-supporting region, at least taking into account the tapped measurement voltage and the tapped reference voltage.

What is claimed is:

1. A micromechanical component for a capacitive pressure sensor device, the micromechanical component comprising:
a substrate;
a frame structure that frames a partial surface of the substrate and/or of at least one intermediate layer on the substrate;
a membrane that is tensioned by the frame structure in such a way that a self-supporting region of the membrane extends over the framed partial surface, with an internal volume between the membrane and the framed partial surface;

at least one first connector protruding from a radially interior region of the membrane towards the framed partial surface;

a counter-electrode in the internal volume and attached to the membrane via the at least one first connector;

a measurement electrode that is situated on the framed partial surface;

a reference counter-electrode;

a reference measurement electrode that is situated on the framed partial surface and is electrically insulated from the measurement electrode; and a second connector protruding from a radially exterior region of the membrane towards the substrate;

wherein:

the internal volume is enclosed by the frame structure and is air-tightly sealed with a reference pressure therein;

the self-supporting region of the membrane is deformable by a physical pressure that is applied on an external side of the self-supporting region, oriented away from the internal volume, when the physical pressure is unequal to the reference pressure;

the reference counter-electrode is connected to the membrane by attachment of a radially exterior half of the reference counter-electrode to the second connector; and a radially interior half of the reference counter-electrode is free from the membrane.

2. The micromechanical component of claim 1, wherein the reference counter-electrode is arranged in the self-supporting region and/or on the frame structure and/or on the framed partial surface.

3. The micromechanical component of claim 1, a midpoint of the partial surface framed by the frame structure is definable, the measurement electrode covers the midpoint, and the reference measurement electrode is situated on the framed partial surface at a distance from the midpoint.

4. The micromechanical component of claim 1, wherein the measurement electrode is surrounded by the reference measurement electrode.

5. The micromechanical component of claim 1, wherein:
the self-supporting region of the membrane is deformable by the physical pressure on the external side of the self-supporting region when the physical pressure is greater than the reference pressure such that a mid-region of the self-supporting region is at a smaller distance from the framed partial surface than other partial regions of the self-supporting region;

the measurement electrode is situated on the framed partial surface such that the mid-region of the self-supporting region is displaced towards the measurement electrode by the physical pressure greater than the reference pressure; and the reference measurement electrode is situated on the framed partial surface such that an edge region of the self-supporting region, outside the mid-region, is bent in the direction towards the reference measurement electrode by the physical pressure greater than the reference pressure.

6. The micromechanical component of claim 1, wherein the reference counter-electrode is arranged in the internal volume.

7. The micromechanical component of claim 1, wherein the reference counter-electrode extends at least partially circumferentially around the counter-electrode.

8. The micromechanical component of claim 1, wherein the counter-electrode is arranged at a radial center of the membrane.

9. The micromechanical component of claim 1, wherein the at least one first connector includes one first connector at a center of the counter-electrode and another first connector at a radial exterior half of the counter-electrode.

10. The micromechanical component of claim 1, wherein:
the micromechanical component includes electrical contacts for tapping a measurement voltage between the measurement electrode and the counter-electrode and for tapping a reference voltage between the reference measurement electrode and the reference counter-electrode; and the measurement electrode, reference measurement electrode, counter-electrode, and reference counter-electrode are arranged:
with a distance between the measurement electrode and the counter-electrode being different than a distance between the reference measurement electrode and the reference counter-electrode when the physical pressure is equal to the reference pressure;

so that the measurement voltage and the reference voltage are unequal when the physical pressure is equal to the reference pressure; and so that, when the physical pressure is at a predefined pressure value that is unequal to the reference pressure, the measurement voltage and the reference voltage are equal.

11. The micromechanical component of claim 10, wherein the counter-electrode is situated relative to the measurement electrode and the reference counter-electrode is situated relative to the reference measurement electrode such that, when the physical pressure on the external side of the self-supporting region is equal to the reference pressure, the counter-electrode is at a first distance from the measurement electrode and the reference measurement electrode is at a second distance, that is less than the first distance, from the reference counter-electrode.

12. The micromechanical component of claim 10, wherein the measurement electrode, reference measurement electrode, counter-electrode, and reference counter-electrode are arranged so that, when the physical pressure is at the predefined pressure value that is unequal to the reference pressure, the distance between the measurement electrode and the counter-electrode is equal to the distance between the reference measurement electrode and the reference counter-electrode.

13. A capacitive pressure sensor device comprising:
evaluation electronics; and
a micromechanical component for a capacitive pressure sensor device, the micromechanical component including:
a substrate;
a frame structure that frames a partial surface of the substrate and/or of at least one intermediate layer on the substrate;
a membrane that is tensioned by the frame structure in such a way that a self-supporting region of the membrane extends over the framed partial surface, with an internal volume between the membrane and the framed partial surface;

at least one first connector protruding from a radially interior region of the membrane towards the framed partial surface;

a measurement electrode that is situated on the framed partial surface;

a reference measurement electrode that is situated on the framed partial surface and is electrically insulated from the measurement electrode;

a counter-electrode arranged in the internal volume and attached to the membrane via the at least one first connector;

a reference counter-electrode; and a second connector protruding from a radially exterior region of the membrane towards the substrate;

wherein:

the internal volume is enclosed by the frame structure and is air-tightly sealed with a reference pressure therein;

the self-supporting region of the membrane is deformable by a physical pressure that is applied on an external side of the self-supporting region, oriented away from the internal volume, when the physical pressure is unequal to the reference pressure;

the measurement electrode and the counter-electrode are capable of being electrically contacted for tapping a measurement voltage between the measurement electrode and the counter-electrode;

the reference measurement electrode and the reference counter-electrode are capable of being electrically contacted for tapping a reference voltage between the reference measurement electrode and of the reference counter-electrode;

the evaluation electronics is configured to:

determine, based on the tapped measurement voltage and the tapped reference voltage, a measurement value relating to the physical pressure prevailing on the external side of the self-supporting region; and output the determined measurement value;

the reference counter-electrode is connected to the membrane by attachment of a radially exterior half of the reference counter-electrode to the second connector; and a radially interior half of the reference counter-electrode is free from the membrane.

14. A method of producing a micromechanical component for a capacitive pressure sensor device, the method comprising:

forming on a substrate a frame structure that frames a partial surface of the substrate and/or of at least one intermediate layer on the substrate;

tensioning a membrane via the frame structure in such a way that a self-supporting region of the membrane extends over the framed partial surface, with an internal volume between the membrane and the framed partial surface, wherein the self-supporting region of the membrane is deformable by a physical pressure that is applied on an external side of the self-supporting region, oriented away from the internal volume, when the physical pressure is unequal to a reference pressure in the internal volume;

situating a measurement electrode on the framed partial surface;

arranging a measurement counter-electrode in the internal volume;

situating on the framed partial surface a reference measurement electrode that is electrically insulated from the measurement electrode;

providing a first connector; and providing a reference counter-electrode;

wherein the method includes at least one of the following two features (I) and (II):

(I) (a) the arranging of the measurement counter-electrode includes attaching the measurement counter electrode to at least one second connector that protrudes from a radially interior region of the membrane towards the framed partial surface, (b) the first connector protrudes from a radially exterior region of the membrane towards the substrate, (c) the providing of the reference counter-electrode includes connecting the reference counter-electrode to the membrane by attachment of a radially exterior half of the reference counter-electrode to the first connector, with a radially interior half of the reference counter-electrode being free from the membrane; and (II) (a) the measurement counter electrode is arranged opposite the measurement electrode, (b) the reference counter-electrode is arranged opposite the reference measurement electrode and in the internal volume, (c) the first connector extends, in a direction towards the substrate, from the membrane to a radial exterior edge of the reference counter-electrode, (d) the radial exterior edge of the reference counter-electrode is suspended from the membrane by the first connector, with a remainder of the reference counter-electrode, including a radial majority of the reference counter-electrode, being free from the membrane, and (e) at least one of a center of the measurement-counter electrode and a radial exterior part of the measurement-counter electrode is connected to the membrane.

15. The method of claim 14, wherein the reference counter-electrode is arranged in the self-supporting region and/or on the frame structure and/or on the framed partial surface.

16. A method for producing a capacitive pressure sensor device, the method comprising:

producing a micromechanical component, the production of the micromechanical component comprising:

forming on a substrate a frame structure that frames a partial surface of the substrate and/or of at least one intermediate layer on the substrate;

tensioning a membrane via the frame structure in such a way that a self-supporting region of the membrane extends over the framed partial surface, with an internal volume between the membrane and the framed partial surface, wherein the self-supporting region of the membrane is deformable by a physical pressure that is applied on an external side of the self-supporting region, oriented away from the internal volume, when the physical pressure is unequal to a reference pressure in the internal volume;

situating a measurement electrode on the framed partial surface;

arranging a measurement counter-electrode in the internal volume;

situating on the framed partial surface a reference measurement electrode that is electrically insulated from the measurement electrode;

providing a first connector; and providing a reference counter-electrode; and providing evaluation electronics configured to:
  determine, based on input from electrical contacts of a tapped measurement voltage between the measurement electrode and the measurement counter-electrode and a tapped reference voltage between the reference measurement electrode and the reference counter-electrode, a measurement value relating to the physical pressure prevailing on the external side of the self-supporting region; and
  output the determined measurement value;
wherein the method includes at least one of the following two features (I) and (II):
  (I) (a) the arranging of the measurement counter-electrode includes attaching the measurement counter electrode to at least one second connector that protrudes from a radially interior region of the membrane towards the framed partial surface, (b) the first connector protrudes from a radially exterior region of the membrane towards the substrate, (c) the providing of the reference counter-electrode includes connecting the reference counter-electrode to the membrane by attachment of a radially exterior half of the reference counter-electrode to the first connector, with a radially interior half of the reference counter-electrode being free from the membrane; and
  (II) (a) the measurement counter electrode is arranged opposite the measurement electrode, (b) the reference counter-electrode is arranged opposite the reference measurement electrode and in the internal volume, (c) the first connector extends, in a direction towards the substrate, from the membrane to a radial exterior edge of the reference counter-electrode, (d) the radial exterior edge of the reference counter-electrode is suspended from the membrane by the first connector, with a remainder of the reference counter-electrode, including a radial majority of the reference counter-electrode, being free from the membrane, and (e) at least one of a center of the measurement-counter electrode and a radial exterior part of the measurement-counter electrode is connected to the membrane.

17. A micromechanical component for a capacitive pressure sensor device, the micromechanical component comprising:
  a substrate;
  a membrane;
  a frame structure that frames a partial surface of the substrate and/or of at least one intermediate layer on the substrate, with an internal volume between the membrane and the framed partial surface, wherein the internal volume is circumferentially enclosed by the frame structure and is air-tightly sealed with a reference pressure therein and wherein the membrane is tensioned by the frame structure in such a way that a self-supporting region of the membrane extends over the framed partial surface;
  a measurement electrode that is situated on the framed partial surface;
  a reference measurement electrode that is situated on the framed partial surface and is electrically insulated from the measurement electrode;
  a measurement counter-electrode opposite the measurement electrode; and
  a reference counter-electrode opposite the reference measurement electrode;
wherein:
  the self-supporting region of the membrane is deformable by a physical pressure that is applied on an external side of the self-supporting region, oriented away from the internal volume, when the physical pressure is unequal to the reference pressure;
  the reference counter-electrode is arranged in the internal volume;
  a radial exterior edge of the reference counter-electrode is suspended from the membrane by a first connector that extends, in a direction towards the substrate, from the membrane to the radial exterior edge of the reference counter-electrode, with a remainder of the reference counter-electrode, including a radial majority of the reference counter-electrode, being free from the membrane;
  the measurement counter-electrode is arranged in the internal volume; and
  at least one of a center of the measurement-counter electrode and a radial exterior part of the measurement-counter electrode is connected to the membrane.

18. The micromechanical component of claim 17, wherein the center of the measurement counter-electrode is connected to the membrane by a second connector that extends from the membrane to the center of the measurement counter-electrode, and the radial exterior part of the measurement counter-electrode is connected to the membrane by a third connector that extends from the membrane to the radial exterior part of the measurement counter-electrode.

19. The micromechanical component of claim 17, wherein the reference counter-electrode is supported by the partial surface of the substrate via a second connector that extends from the reference counter-electrode to the partial surface.

20. The micromechanical component of claim 17, wherein the reference counter-electrode is directly connected to the frame structure.

21. The micromechanical component of claim 20, wherein the reference counter-electrode:
  is formed of a portion of a layer with which at least one of the frame structure and the measuring counter-electrode is formed; and
  extends radially inward from the frame structure.

22. A micromechanical component for a capacitive pressure sensor device, the micromechanical component comprising:
  a substrate;
  a membrane;
  a frame structure that frames a partial surface of the substrate and/or of at least one intermediate layer on the substrate, with an internal volume between the membrane and the framed partial surface;
  a measurement electrode that is situated on the framed partial surface;
  a reference measurement electrode that is situated on the framed partial surface and is electrically insulated from the measurement electrode;
  a measurement counter-electrode opposite the measurement electrode; and
  a reference counter-electrode that is arranged opposite the reference measurement electrode and that is supported by the framed partial surface via a connector that extends from the reference counter-electrode towards the framed partial surface, with at least part of the reference counter-electrode being between the membrane and the reference measurement electrode;

wherein:
the internal volume is circumferentially enclosed by the frame structure and is air-tightly sealed with a reference pressure therein;
the membrane is tensioned in such a way that a self-supporting region of the membrane extends over the framed partial surface;
the self-supporting region of the membrane is deformable by a physical pressure that is applied on an external side of the self-supporting region, oriented away from the internal volume, when the physical pressure is unequal to the reference pressure; and
the micromechanical component includes at least one of the following features (a)-(b):
(a) the connector extends from a radially interior half of the reference counter-electrode towards the framed partial surface, and an entirety of the reference measurement electrode is positioned radially exterior to the connector; and
(b) the reference measurement electrode includes a radially interior region and a radially exterior region, and the connector extends towards the framed partial surface through an electrically isolated area between the radially interior region of the reference measurement electrode and the radially exterior region of the reference measurement electrode.

23. The micromechanical component of claim 22, wherein the connector extends from the radially interior half of the reference counter-electrode towards the framed partial surface, and the entirety of the reference measurement electrode is positioned radially exterior to the connector.

24. The micromechanical component of claim 23, wherein the connector extends from a radially interior edge of the reference counter-electrode towards the framed partial surface.

25. The micromechanical component of claim 22, wherein the reference measurement electrode includes the radially interior region and the radially exterior region, and the connector extends towards the framed partial surface through the electrically isolated area between the radially interior region of the reference measurement electrode and the radially exterior region of the reference measurement electrode.

* * * * *